July 28, 1964 R. S. JOSEPH ETAL 3,142,408

ENCLOSURE COVER

Filed April 8, 1963

INVENTORS:
RAYMOND S. JOSEPH,
PETER KOROL,
ROBERT J. WALLIS,

BY Frank J. Thompson
THEIR ATTORNEY.

United States Patent Office 3,142,408
Patented July 28, 1964

3,142,408
ENCLOSURE COVER
Raymond S. Joseph, Syracuse, Peter Korol, De Witt, and Robert J. Wallis, North Syracuse, N.Y., assignors to General Electric Company, a corporation of New York
Filed Apr. 8, 1963, Ser. No. 271,390
1 Claim. (Cl. 220—24)

Figure 1:
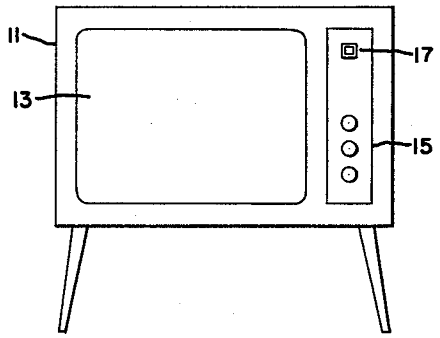

This invention relates to means for concealing an aperture in a wall. The invention relates more particularly to a cover means for concealing an aperture in enclosure walls of relatively widely differing thicknesses.

A requirement at times arises for providing, in an attractive enclosure, an aperture not having present utility yet having a planned function. For example, presently adopted United States governmental regulations effectively require that television receivers which are manufactured after a future date be adapted for receiving television broadcast channls in an ultra high frequency band. Although television receivers currently being produced are not subject to the regulation, it would be convenient for the owner if these receivers were fabricated in a manner for facilitating the future addition thereto of a UHF converter. Accordingly, it is generally desirable to include an aperture in the receiver cabinet from which a tuning shaft of the UHF converter may extend. The aperture would ordinarily exist in a predominant position on the cabinet. However, since television receiver cabinets are designed for stylishness and attractive appearance, the predominant aperture will detract from these features of the cabinet prior to installation of a UHF converter. Thus, it is desirable to provide an attractive means for concealing the aperture.

The enclosure walls, or an element mounted thereto, in which the aperture is located may have a range of widely differing thicknesses. For example, in television receiver enclosures, the thickness of walls or of an escutcheon mounted thereto may be $\frac{1}{40}$ of an inch for a metal cabinet structure and may extend to $\frac{1}{2}$ of an inch or greater for a wood cabinet structure. This large range of thicknessess would ordinarily dictate the use of aperture covers of different design. However, different designs undesirably incur the expense of separate tooling costs. In the production of television receivers, as in various other apparatus having a need for an aperture cover, manufacturing cost is of primary importance and the referred-to separate designs and corresponding separate tooling becomes prohibitively expensive.

Accordingly, it is an object of this invention to provide a relatively inexpensive aperture cover means.

Another object of the invention is to provide an aperture cover means adapted for use with apertures of relatively widely differing thicknesses.

In accordance with the present invention, an aperture is located in an enclosure wall and a cover is provided and mounted thereto for concealing the aperture. The cover comprises a plastic, generally mushroom-shaped button having an integral aperture shielding segment and an integral stem segment. The button is positioned relative to the wall in a manner for extension of the stem segment in the aperture and concealment of the aperture at one surface of the wall by the shielding segment. Means are provided for securing the button to the wall.

Figures 2, 4:
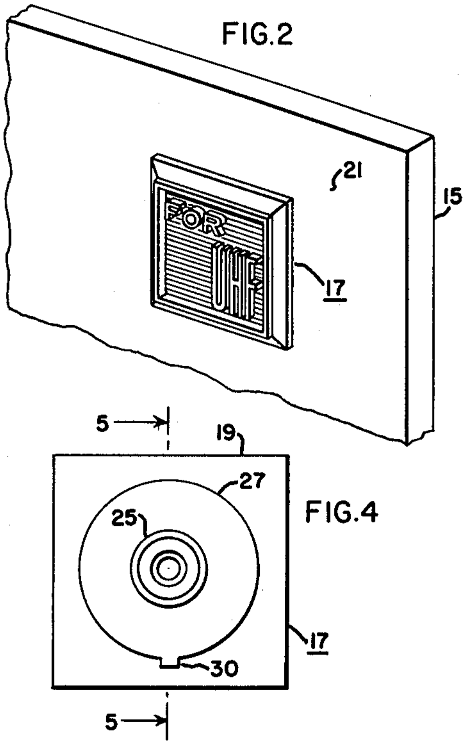
Figures 3, 5:
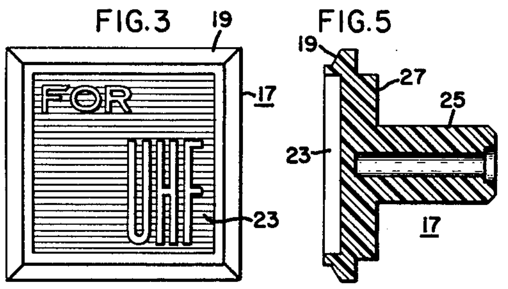
Figures 6, 7, 8:
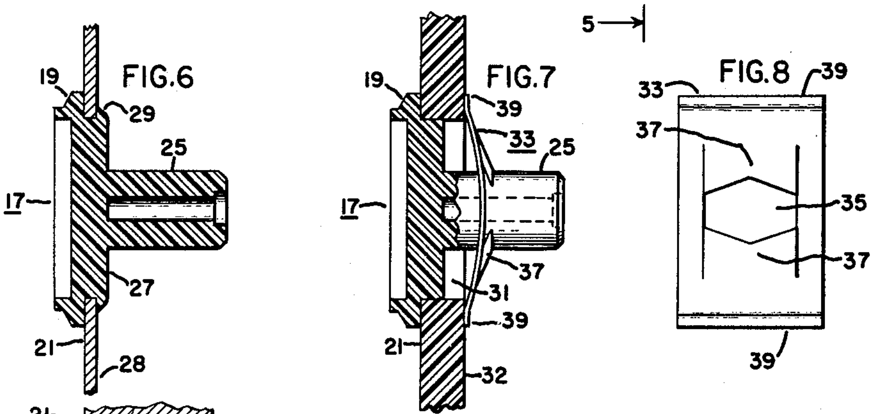
Figure 9:
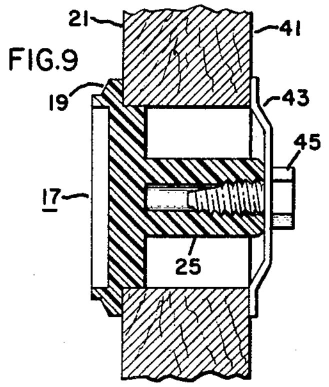
Figure 10:
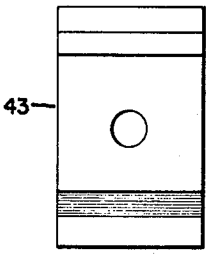

Further objects, features and the attending advantages of the invention will be apparent with reference to the following specification and drawings in which:

FIGURE 1 is a front view of a television receiver illustrating the positioning of an aperture cover on an escutcheon on the cabinet, FIGURE 2 is an enlarged partial view of the escutcheon of FIGURE 1 and illustrating decorative features of the mounted aperture cover, FIGURE 3 is a front elevation view of a button for an aperture cover, FIGURE 4 is a rear elevational view of the button of FIGURE 3, FIGURE 5 is a sectional view taken along lines 5—5 of the button of FIGURE 4, FIGURE 6 is a sectional view of an aperture cover mounted to a wall and illustrating an embodiment of the present invention, FIGURE 7 is a sectional side view of an aperture cover mounted to a wall and illustrating another embodiment of the present invention, FIGURE 8 is another view of a mounting clip shown in the embodiment of the invention illustrated in FIGURE 7, FIGURE 9 is a sectional view of an aperture cover mounted to a wall and illustrating another embodiment of the present invention, and FIGURE 10 is another view of a mounting bracket shown in the embodiment of the invention illustrated in FIGURE 9.

In FIGURE 1, a television receiver is illustrated having a cabinet 11, a picture tube 13 mounted therein, and an escutcheon 15 including various control knobs mounted thereon as well as an aperture concealing cover 17. The enlarged partial view in FIGURE 2 of the escutcheon 15 shows the cover 17 in more detail and indicates its decorative appearance. In addition to its function of concealing an unattractive aperture located in the escutcheon, the cover may include any suitable inscription thereon such as that indicated, which informs the owner of the feature of provision for mounting a UHF converter to the receiver.

In accordance with a feature of this invention, the aperture concealing cover comprises a generally mushroom-shaped plastic button and means for mounting the button to the escutcheon. Referring now to the more detailed views of the button in FIGURES 3, 4 and 5, the button 17 is shown to comprise a unitary molded plastic piece having a shielding segment 19 for concealing an aperture in a first outer surface 21 of the escutcheon 15. Shielding segment 19 is shown to include a decorative recessed portion 23. A stem segment 25 is formed as an integrally molded segment of the button. The stem is of relatively smaller cross-sectional area than the shielding segment and extends therefrom in a plane perpendicular to a plane of the shielding segment. The button 17 may be molded from any suitable plastic material. One plastic material from which the button may be molded is a high-impact, high-heat polystyrene.

Mounting means are provided for securing the button to a wall. In the arrangement illustrated in FIGURE 6, the mounting means comprises an integrally molded shoulder segment 27, which is heat sealed to a wall 28 of relatively small thickness. The button is positioned in the aperture for extension of the shoulder segment 27 therein. Shoulder 27 is then heated to a temperature, by any suitable means, for causing the plastic shoulder material to flow and form gripping members 29 which secure the button to the wall. The shielding segment 19 limits axial motion of the button to the right as viewed in FIGURE 6 while the members 29 of the heat sealed shoulder segment limit axial motion to the left.

In addition to providing a heat sealing mounting means, the shoulder segment 27 may assume a shape and have a dimension suitable for providing location of the button in the aperture. For example, the shoulder 27 may be circular as shown in FIGURE 5 and have an outside diameter slightly smaller than an outside diameter of a circular aperture which is to be covered. For inhibiting rotary motion of the button in the wall, a key 30 is provided for cooperation with a keyway in the wall. For the purpose of clarity, in the drawings, the keyway 31 is indicated only in FIGURE 7.

In another embodiment of the present invention, as illustrated in FIGURE 7, the button 17 is secured in an aperture of a wall 32 of relatively medium thickness by a spring clip 33, which is best seen in FIGURE 8. The stem segment 25 extends through an aperture 35 in the clip. The aperture 35 is defined by tab segments 37. These tabs grasp the stem segment 25 and secure the clip thereto. Oppositely disposed end portions 39 of the clip 33 about an inner surface of the wall and a binding force exerted between the wall and button secures the button in fixed position in the aperture.

In another embodiment of the present invention as illustrated in FIGURE 9, means for mounting the button to a wall 41 of relatively large thickness comprise a washer 43 and a screw 45 which is of the self tapping type and which is secured to the tubular segment 25 by self tapping into a cavity of the tubular segment 25.

Thus we have described a decorative cover requiring a single moulded piece which is adapted for mounting to walls of widely differing thicknesses.

Although we have described our invention with relation to an escutcheon for a television receiver, it is obvious that the invention may equally well be mounted directly to walls of various other enclosures.

While we have illustrated and described and pointed out in the annexed claim certain novel features of our invention, it will be understood that various omissions, substitutions and changes in the forms and details of the system illustrated may be made by those skilled in the art without departing from the spirit of the invention and the scope of the claim.

What we claim is:

In a television receiver apparatus: a cabinet for the receiver having a circular aperture predominantly located in the cabinet; a generally mushroom-shaped button having a shield segment, a circular shoulder segment of diameter slightly less than a diameter of the aperture, and a stem segment having a cavity therein; said button positioned on said cabinet for extension of said shoulder in said aperture; and means for securing said button to said cabinet.

References Cited in the file of this patent

UNITED STATES PATENTS 2,118,746 Tinnerman ------------ May 24, 1938
2,224,296 Hoffman -------------- Dec. 10, 1940

FOREIGN PATENTS 300,350 Great Britain ---------- Nov. 15, 1928